United States Patent [19]

Shirai

[11] Patent Number: 5,087,954
[45] Date of Patent: Feb. 11, 1992

[54] MOS-TYPE INTEGRATED CIRCUIT

[75] Inventor: Koji Shirai, Kawasaki, Japan

[73] Assignee: Kabushiki Kaisha Toshiba, Kawasaki, Japan

[21] Appl. No.: 598,206

[22] Filed: Oct. 16, 1990

[30] Foreign Application Priority Data

Oct. 19, 1989 [JP] Japan .................. 1-272074

[51] Int. Cl.$^5$ .................................................. H01L 27/02
[52] U.S. Cl. .................................. 357/41; 357/23.4; 357/42; 357/46; 357/48; 357/59
[58] Field of Search ................ 357/41, 42, 46, 48, 357/59, 23.4

[56] References Cited

U.S. PATENT DOCUMENTS 4,403,395 9/1983 Curran .
4,628,341 12/1986 Thomas .
4,879,584 11/1989 Takagi et al. .................. 357/42
4,890,146 12/1989 Williams et al. ............... 357/42

Primary Examiner—Edward J. Wojciechowicz
Attorney, Agent, or Firm—Finnegan, Henderson, Farabow, Garrett and Dunner

[57] ABSTRACT

In a MOS-type integrated circuit, a source and a gate of a double diffusion MOSFET of an n-channel type and a drain and a gate of a double diffusion MOSFET of a p-channel type are in an island region surrounded by an n-type annular contact region having high impurity concentration. An n epitaxial layer, in each island region, is used for the sources and drains of both MOSFETs. The drain electrode of the p-channel MOSFET is connected to the gate electrode of the n-channel MOSFET. With this structure, the power consumption of the circuit is decreased, and the operating speed thereof is increased.

6 Claims, 6 Drawing Sheets

MOS-TYPE INTEGRATED CIRCUIT

BACKGROUND OF THE INVENTION

1. Field of the Invention

This invention relates to a MOS-type integrated circuit for use as an output circuit element of a high breakdown-voltage integrated circuit.

2. Description of the Related Art

In the conventional output circuit of a high breakdown-voltage integrated circuit, a p-channel MOSFET having high breakdown voltage and serving as a level shifter, and an n-channel D-MOSFET having high breakdown voltage, are in different island regions of a silicon semiconductor substrate, and are electrically isolated from each other.

The structure of this output circuit will be explained, with reference to FIG. 1 showing an essential part thereof. After an oxide (not shown) is deposited on a surface of a p-type silicon semiconductor substrate 50 having boron-concentration of about $5 \times 10^{14}/cm^3$, openings are formed in the oxide film at predetermined locations by means of photo lithography. Through the openings, antimony (Sb) is doped in the substrate 50. Then, a layer 51, having a phosphorus concentration of $1 \times 15^{15}/cm^3$, is epitaxially formed on the substrate, thus forming buried regions 52 having an antimony concentration of about $10^{18}/cm^3$. p-isolating regions 53, having a surface impurity-concentration of about $1 \times 10^{19}/cm^3$, are formed in the n--epitaxial layer 51, defining island regions. Further, deep n-regions 54, having a surface impurity-concentration of about $1 \times 10^{19}/cm^3$, are formed at the both sides of the buried regions 52. In the upper end portion of the deep n-region 54 of one of the buried regions 52, n-region 55, having a surface arsenic-(As)-concentration of about $1 \times 10^{20}/cm^3$, is formed such that it is in ohmic contact with an electrode to be formed later.

A p--region 56, having a surface boron-concentration of about $1 \times 10^{17}/cm^3$, is formed in one of the island regions of the n--epitaxial layer 51. In the p-region 56, n+-regions 57, having a surface As-concentration of about $1 \times 10^{20}/cm^3$, are formed. A p+-region 58 is formed between the regions 57. The region 58 has a surface boron-concentration of about $1 \times 10^{20}/cm^3$. On the other hand, in the other island region, an n--region 59, having a phosphorus concentration of about $1 \times 10^{17}/cm^3$, is formed such that it contacts one of the deep n-regions 54. In the region 59, a p+-region 60 and an n+-region 61 are formed such that they contact each other. The region 60 has a surface boron-concentration of about $1 \times 10^{20}/cm^3$, and the region 61 has a surface arsenic-concentration of about $1 \times 10^{20}/cm^3$. Moreover a p-region 62 is formed such that it contacts the region 59. The region 62 is formed by doping boron about $5 \times 10^{16}/cm^3$, and has a large Xj. In the region 62, a p-region 63 is formed which has a surface boron-concentration of about $1 \times 10^{20}/cm^3$.

The pn junctions formed of the above-described various impurity regions are exposed in the surface of the layer 51, and are protected by an insulating layer 64. While the layer 64 is shown as one layer in FIG. 1, it is formed of a CVD oxide layer and a thermally oxidized film. Polycrystal silicon layers 65 are buried in the insulating layer 64. A gate electrode 66, a source electrode 67 and a drain electrode 68 made of Al or Al alloy are provided at related openings. Each opening is formed by removing part of the insulating layer 64 above the polycrystal silicon layer 65. A resistor 69 made of polycrystal silicon is formed on the insulating layer 64, and connected to the source and drain electrodes 67 and 68.

As is described above, the p-channel MOSFET and n-channel MOSFET are in different island regions of the conventional MOS-type integrated circuit. This structure makes the circuit have a large total parasitic capacitance as much as that of two MOSFETs, since parasitic capacitance is proportional to the area of an element. This being so, an extra amount of current is charged or discharged for the parasitic capacitance during the operation of the circuit, inevitably increasing the power consumption, and also increasing the time required for the charge/discharge and hence decreasing the operation speed.

SUMMARY OF THE INVENTION

This invention has been made to overcome the above-described disadvantages, and therefore intends to save the power consumption of an output circuit having high breakdown voltage and comprising a MOS-type integrated circuit, and also to increase the operation speed of the circuit.

To attain the above object, the MOS-type integrated circuit of the present invention comprises:

a semiconductor substrate of a first conductivity type;

a semiconductor layer of a second conductivity type, formed on the semiconductor substrate;

a buried region of the second conductivity type, having high impurity concentration and formed between the semiconductor substrate and semiconductor layer;

an annular contact region of the second conductivity type, extending from the buried region to the surface of the second conductivity-type semiconductor layer and having high impurity concentration; and a drain and a gate of a MOSFET of a first conductivity channel type, and a source and a gate of a MOSFET of a second conductivity channel type, the MOSFETs being formed in that region of the second conductivity-type semiconductor layer which is defined by the annular contact regions;

wherein the second conductivity-type semiconductor layer is used for sources and drains of the MOSFETs, and a drain electrode of the MOSFET of the first conductivity channel type is connected to a gate electrode of the MOSFET of the second conductivity channel type.

According to another aspect of the invention, the MOS-type integrated circuit comprises:

a semiconductor substrate of a first conductivity type;

a semiconductor layer of a second conductivity type, formed on the semiconductor substrate;

a buried region of the second conductivity type, having high impurity concentration and formed between the semiconductor substrate and semiconductor layer;

an annular contact region of the second conductivity type, extending from the buried region to the surface of the semiconductor layer and having high impurity concentration;

a first region of the second conductivity type, formed in contact with the second conductivity-type annular contact region and having low impurity concentration;

a first region of the first conductivity type and a first region of the second conductivity type, which have high impurity concentration and which are formed in contact with each other in the first region of the second conductivity type, having low impurity concentration;

a first region of the first conductivity type, having low impurity concentration and formed in contact with the first region of the second conductivity type, having low impurity concentration;

a second region of the first conductivity type, having high impurity concentration and formed in the first region of the first conductivity type, having low impurity concentration;

a second region of the first conductivity type, having low impurity concentration and formed from the upper surface of the semiconductor layer of the second conductivity type surrounded by the annular contact region;

a second region of the second conductivity type, a third region of the first conductivity type, and a third region of the second conductivity type, which have high impurity concentration, and are formed in the second region of the first conductivity type, having low impurity concentration, and which are continuous in the order;

an insulating layer covering junctions, which are formed by the regions of different conductivity types, and exposed in the surface of the semiconductor layer of the second conductivity type;

a first polycrystal silicon layer buried in the insulating layer at a location corresponding to the first region of the second conductivity type, having low impurity concentration and surrounding the first region of the first conductivity type, having high impurity concentration, and the first region of the second conductivity type, having high impurity concentration;

a second polycrystal silicon layer buried in the insulating layer at a location corresponding to the second region of the first conductivity type, having low impurity concentration and surrounding the second region of the second conductivity type, the third region of the first conductivity type, and the third region of the second conductivity type, these three regions having high impurity concentration;

a drain electrode electrically connected to the first region of the first conductivity type, having high impurity concentration, and to the first region of the second conductivity type, having high impurity concentration, the drain electrode projecting from the surface of the insulating layer;

a source electrode electrically connected to the third region of the first conductivity type, and to the second and third regions of the second conductivity type, these three regions having high impurity concentration, and the source electrode projecting from the surface of the insulating layer; and first and second gate electrodes electrically connected to the first and second polycrystal layers, and projecting from the surface of the insulating layer.

The MOS-type integrated circuit of the invention can be made approximately 100 μm long, whereas the conventional circuit is about 200 μm long. Thus, the pn-junction area of the element can be made about ⅔ or less of that in the conventional circuit, which saves about 10% of the power consumption of the entire circuit, and also increases the operating speed of the element by 30% or so.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figure 1:
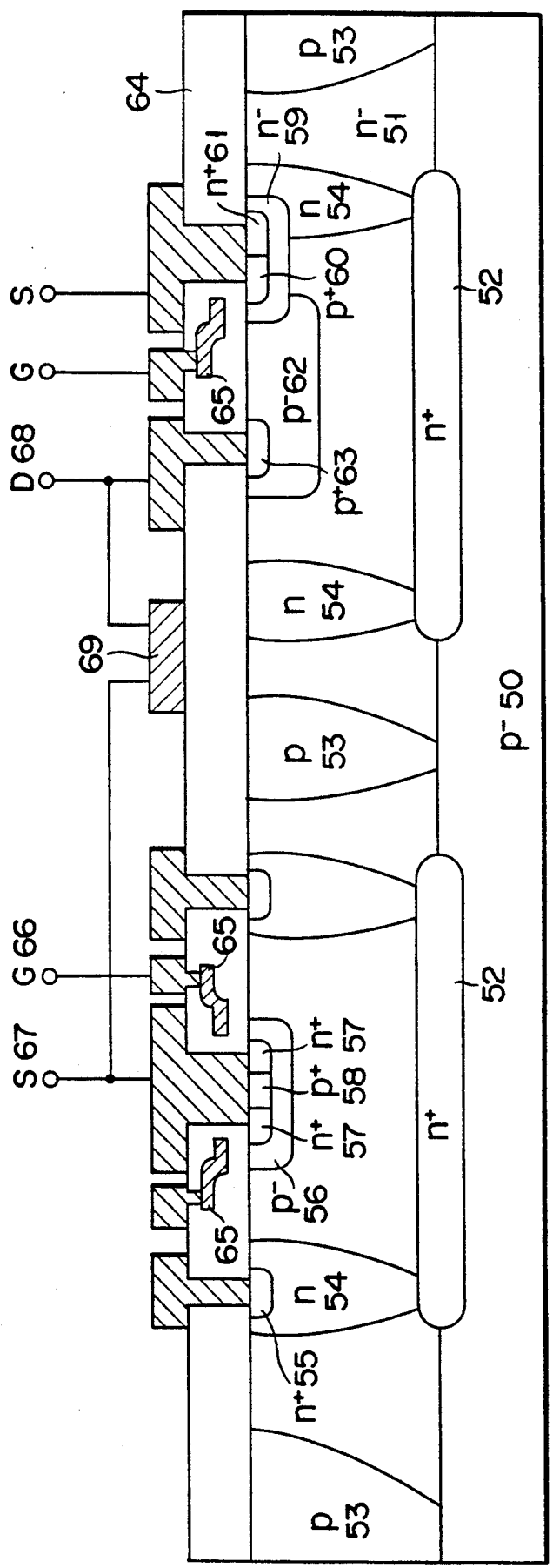
FIG. 1 is a sectional view of an essential part of a conventional MOS-type integrated circuit.
Figure 2:
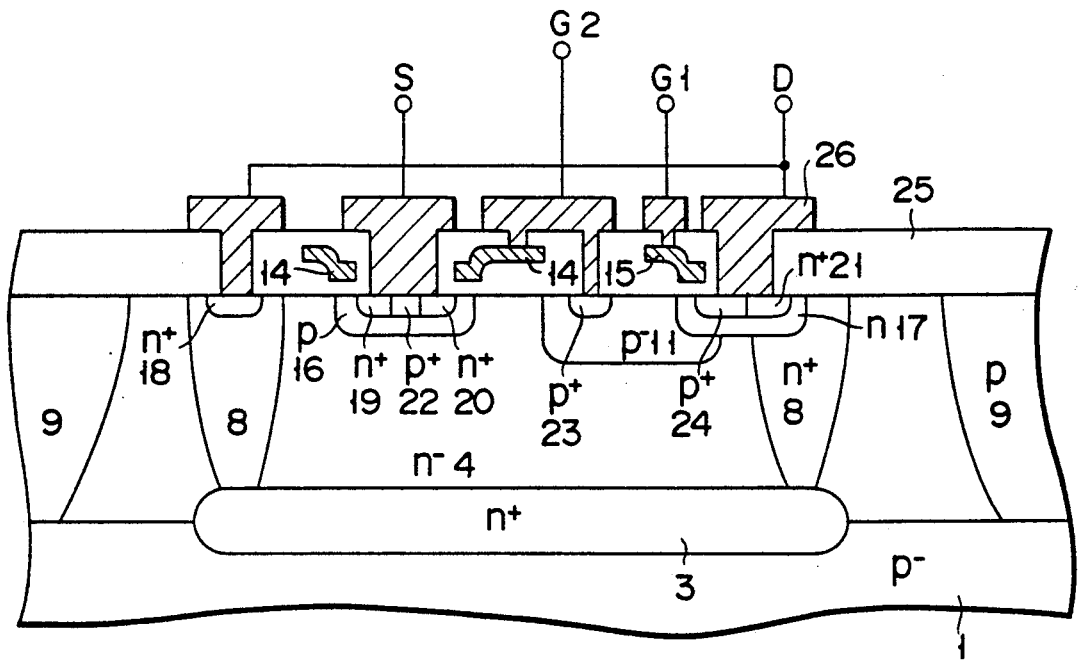
FIG. 2 is a sectional view of an essential part of a MOS-type integrated circuit according to the present invention.
Figure 3:
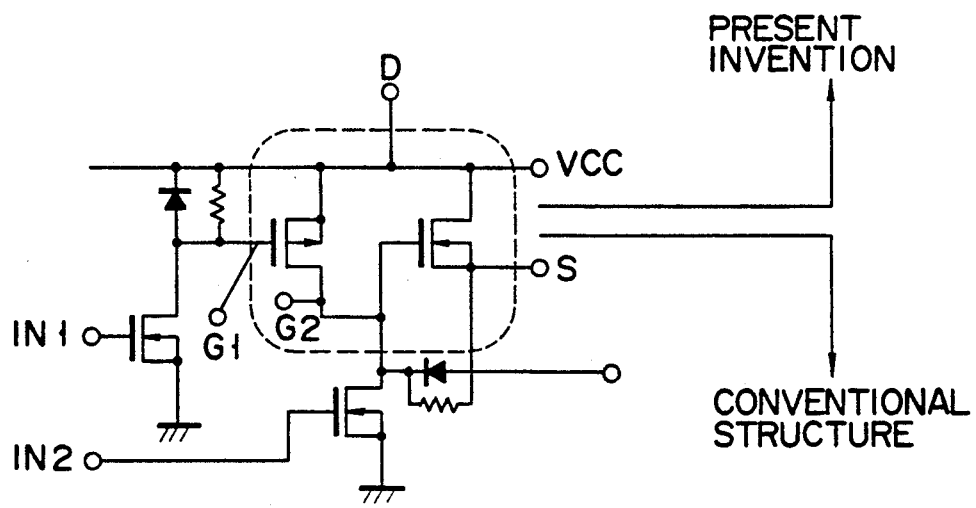
FIG. 3 is a circuit diagram of an output circuit having high breakdown voltage, useful in comparing the structure of the present invention to that of the conventional circuit.

This invention will now be explained with reference to FIGS. 2 to 4 showing an embodiment thereof.

The structure shown in FIG. 2 is manufactured by the process shown in FIGS. 4A to 4M.

Figure 4A:
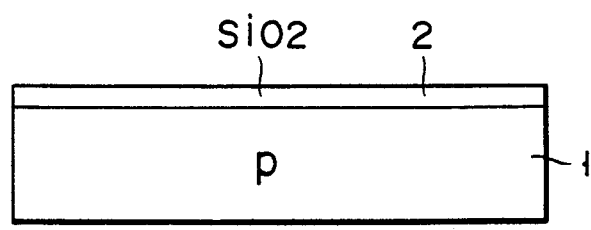
FIGS. 4A through 4M show sectional views explaining the manufacturing process of the MOS-type integrated circuit in order, according to the invention.
Figure 4B:
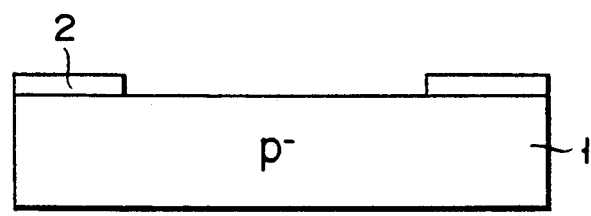
Figure 4C:
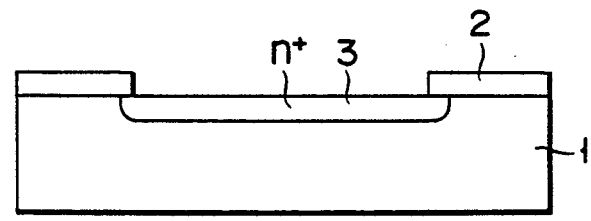
Figure 4D:
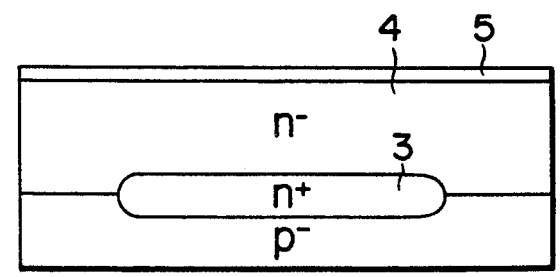

An oxide film 2 having a thickness of 0.1 μm is laminated on a p-type silicon semiconductor substrate 1, which has a boron (B) concentration of $5 \times 10^{14}/cm^3$, by steam oxidization at 1100° C. (FIG. 4A). An opening is formed in a predetermined portion of the oxide film 2 by photoetching (FIG. 4B). Subsequently, a predetermined amount of antimony (Sb) is doped and diffused in the surface of the exposed portion of the p-type silicon semiconductor substrate, to thereby form a base of a buried region 3, which has an Sb concentration of $10^{18}/cm^3$, as is shown in FIG. 4C. Then, as is shown in FIG. 4D, an n--layer 4, having a phosphorus (P) concentration of about $1 \times 10^{15}/cm^3$, is deposited on the substrate 1 and base 3 by means of epitaxial growth method, until it has a thickness of 1.5 μm. Further, an oxide film 5 having a thickness of 0.1 μm is formed on the n--layer 4 by steam oxidization at about 1000° C., which film is to be used as a mask in ion-implantation step, hereinafter referred to. As a result, the buried region 3, having the above-described surface impurity-concentration and a thickness of about 3 μm, is formed between the p-type silicon semiconductor substrate 1 and n--layer 4.

Figure 4E:
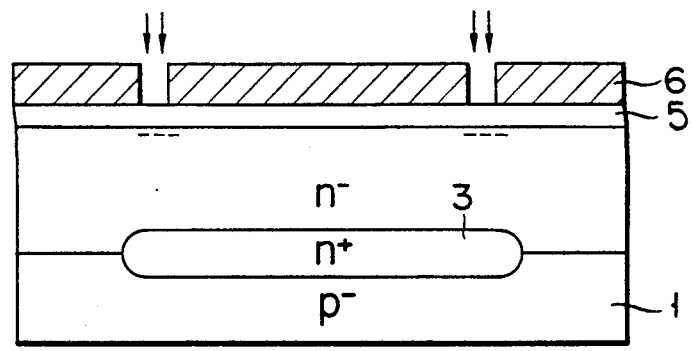
Figure 4F:
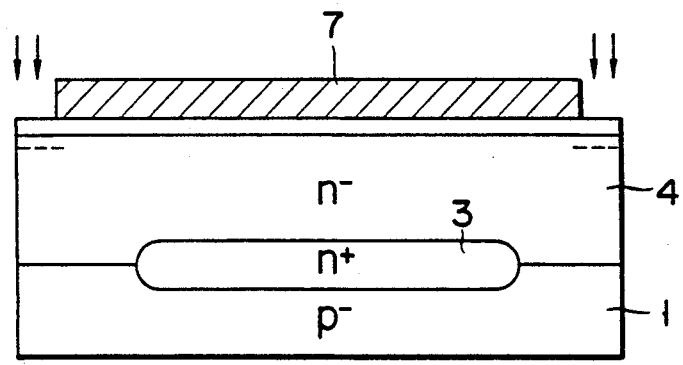

As is shown in FIG. 4E, a photo-resist pattern 6 is deposited on the mask oxide film 5, which pattern has an annular opening formed therein at a location corresponding to an annular deep diffusion layer 8 and 8 (hereinafter referred to), to be formed as contacts of the buried region 3. Thereafter, phosphorus is doped in the n--layer 4 by ion-implantation method. Further, after the photo-resist pattern 6 is removed from the layer 4, another photo-resist pattern 7 having opening, for forming isolating region by diffusion, is deposited on the same, through which opening boron is doped in the layer 4 by the ion-implantation method, as is shown in FIG. 4F. The photo-resist pattern 7 is then removed, and the chip is heated in the atmosphere of nitrogen at 1200° C. for an hour, thus making the ion-diffused layer reach the buried region 3 and the boundary between the n—-layer 4 and p-type silicon substrate 1, thereby forming the annular deep n-region (i.e., annular contact region) 8 and 8 and isolating region 9 and 9. The deep n-region 8 and isolating region 9 have a surface impurity-concentration of about $1 \times 10^{19}/cm^3$.

Figure 4G:
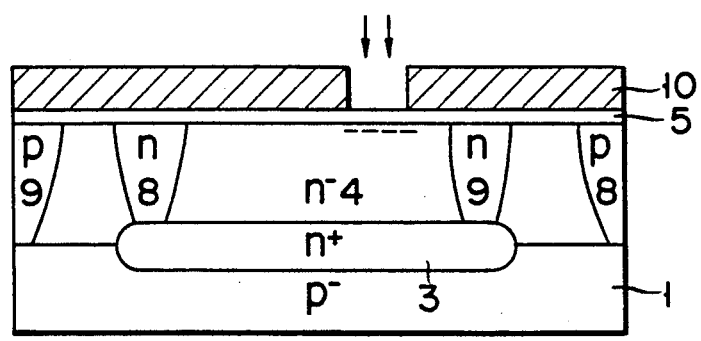
Figure 4H:
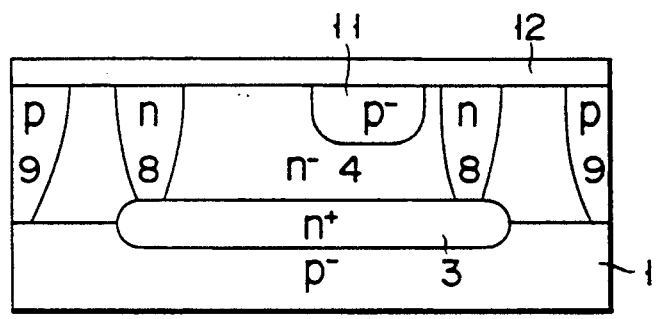

Subsequently, a photo-resist pattern 10 having an opening for forming a high-resist drain region for a p-channel MOSFET, and boron is doped in the layer 4, as is shown in FIG. 4G. Thereafter, the photoresist pattern is removed, and the chip is subjected to slumping process, in which it is heated in the atmosphere of nitrogen at 1200° C. In this process, a drain high-resistance region (i.e., a first region of the first conductivity type) 11, having a low surface impurity-concentration of $5 \times 10^{16}/cm^3$ and a thickness of 4 $\mu$m, is formed, and a thermal oxide film 12 having a thickness of 1 $\mu$m is formed by a known method, after the mask oxide film 5 is removed, as is shown in FIG. 4H.

Figure 4I:
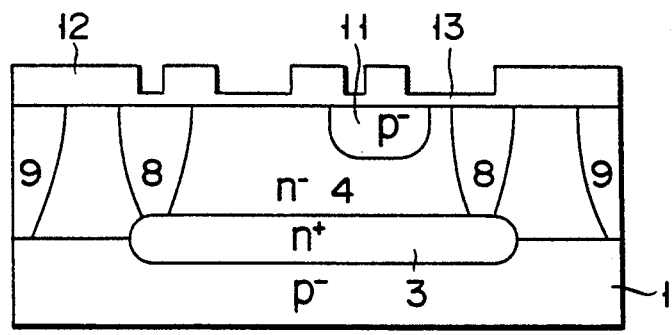

A new photo-resist pattern is formed on the oxide film 12, and predetermined portions of the film is removed therefrom by isotropic or aerotropic etching, thereby exposing the n—-layer 4 (FIG. 4I). Subsequently, a gate oxide film 13 having a thickness of 0.1 $\mu$m is formed on the layer 4 by oxidization with the use of steam of 1000° C. First and second polycrystal silicon layers 14 and 15 having a thickness of 5 $\mu$m are deposited by CVD (Chemical Vapor Deposition), and patterned.

Figure 4J:
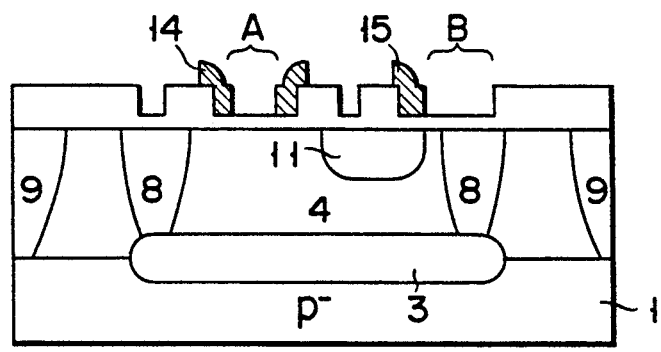
Figure 4K:
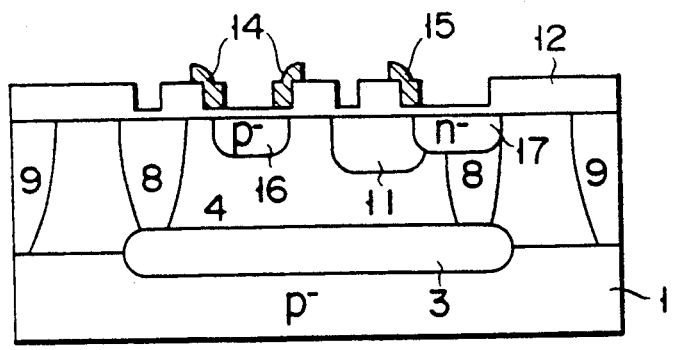

As is shown in FIG. 4J, the polycrystal silicon layer 14 is patterned by photo etching, such that it is provided at a location corresponding to a p-type region 16 (i.e., another region of a first conductivity type) having low impurity concentration, hereinafter referred to. The size of the layer 14 in contact with gate oxide film 13 is substantially equal to the diameter of the p-type region 16 to be formed 1.5 $\mu$m thick by implanting and diffusing boron in the n—-layer 4. Similarly, the other polycrystal silicon layer 15 is patterned by photoetching such that it is provided at a location corresponding to an n-type region 17, hereinafter referred to. The size of the layer 15 is substantially equal to the diameter of the n-type region 17 to be formed 1.5 $\mu$m thick by implanting and diffusing phosphorus in the n—-layer 4. The region 17 functions as a back gate, and has an Xj smaller than the drain high-resistance region 11. To dope boron using the layer 14 as a mask, boron is ion implanted after a photoresist pattern, made such that only a portion indicated by A (FIG. 4J) is open, covers the chip. Then the photo-resist is removed. To dope phosphorus using the layer 15 as a mask, phosphorus is ion implanted after a photo-resist pattern, formed such that only a portion indicated by B (FIG. 4J) is open, covers the chip. Then, the photo-resist is removed and the doped materials are diffused for half an hour at 1200° C. in the atmosphere of nitrogen, as is shown in FIG. 4K.

Subsequently, another photo-resist pattern is provided thereon, which has openings formed at locations corresponding to an N+ (i.e., the second conductivity type) region 18, a region 21 (corresponding to the region indicated by B in FIG. 4J), a region 19, and a region 20, which are to be formed 0.5 $\mu$m thick. Then, arsenic As is doped through the openings by ion implantation, and the chip is subjected to slumping for half an hour at 1000° C. in the atmosphere of nitrogen.

Figure 4L:
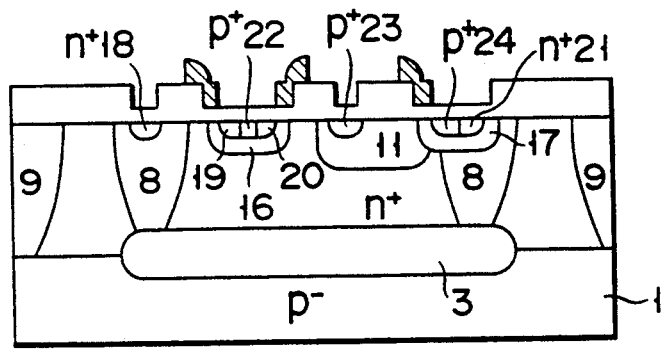

Further, to form a region 22, a region 23, and a region 24, which are the first conductivity or p+-type and have a thickness of 0.5 $\mu$m, another photo-resist pattern is provided on the chip after the previous pattern is removed, which has openings corresponding to the respective regions, then doping boron by ion implantation method, performing thirty-minite slumping at 1000° C. in the atmosphere of nitrogen, and thus obtaining the chip shown in FIG. 4L.

Figure 4M:
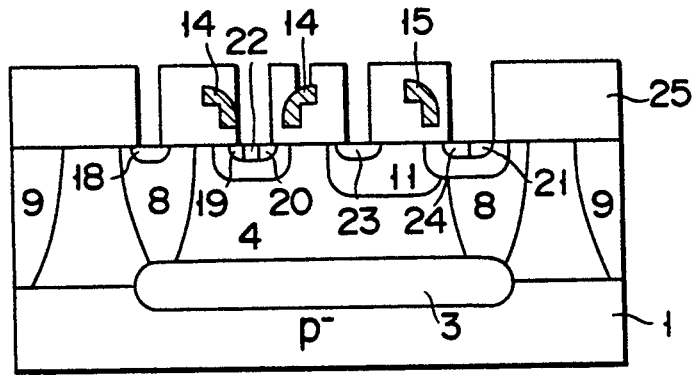

Subsequently, as is shown in FIG. 4M, a silicon oxide layer 25, made of e.g. $SiO_2$, is deposited by the CVD, until the layer has a thickness of 1 $\mu$m, thereafter forming a contact hole by photo etching, further depositing an Al or Al alloy (Al-Si; Al-Si-Cu) layer about 1 $\mu$m thick by the CVD or sputtering, and finally patterning the chip by photo etching to form an electrode 26, as is shown in the completed circuit of FIG. 2. In sintering process, the chip is heated for half an hour at 450° C. in the nitrogen atmosphere. Further, a passivation layer, consisting of a single layer or of a plurality of layers and made of PSG (Phosphor Silicate Glass), silicon nitride or the like, is formed on the surface of the chip in the final process, which process is not shown in the figures. Of course the other semiconductor elements, required for the MOS-type integrated circuit, are incorporated in the other island regions (not explained in the above) of the circuit.

The MOS-type integrated circuit, constructed as above, does not require the conventional resistance 69, as can be understood from FIG. 3, and incorporates the n-channel MOSFET having high breakdown voltage and the level-shifting p-channel MOSFET having high breakdown voltage, which are in the same island region.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A MOS-type integrated circuit comprising:
   a semiconductor substrate of a first conductivity type;
   a semiconductor layer of a second conductivity type, on the semiconductor substrate;
   a buried region of the second conductivity type, having high impurity concentration and located between the semiconductor substrate and semiconductor layer;
   an annular contact region of the second conductivity type, extending from the buried region to the surface of the semiconductor layer and having high impurity concentration;
   a first region of the second conductivity type, in contact with the second conductivity-type annular contact region and having low impurity concentration;
   a first region of the first conductivity type and a first region of the second conductivity type, which have high impurity concentration and which are in contact with each other in the first region of the second conductivity type having low impurity concentration;

a first region of the first conductivity type, having low impurity concentration and in contact with the first region of the second conductivity type, having low impurity concentration;

a second region of the first conductivity type, having high impurity concentration and in the first region of the first conductivity type, having low impurity concentration;

a second region of the first conductivity type, having low impurity concentration and located on the upper surface of the semiconductor layer of the second conductivity type surrounded by the annular contact region;

a second region of the second conductivity type, a third region of the first conductivity type, and a third region of the second conductivity type, which have high impurity concentration, and are in the second region of the first conductivity type, having low impurity concentration, and which are continuous in the order;

an insulating layer covering junctions of the regions of different conductivity types, and exposed in the surface of the semiconductor layer of the second conductivity type;

a first polycrystal silicon layer buried in the insulating layer at a location corresponding to the first region of the second conductivity type, having low impurity concentration and surrounding the first region of the first conductivity type, having high impurity concentration, and the first region of the second conductivity type, having high impurity concentration;

a second polycrystal silicon layer buried in the insulating layer at a location corresponding to the second region of the first conductivity type, having low impurity concentration and surrounding the second region of the second conductivity type, the third region of the first conductivity type, and the third region of the second conductivity type, these three regions having high impurity concentration;

a drain electrode electrically connected to the first region of the first conductivity type, having high impurity concentration, and to the first region of the second conductivity type, having high impurity concentration, the drain electrode projecting from the surface of the insulating layer;

a source electrode electrically connected to the third region of the first conductivity type, and to the second and third regions of the second conductivity type, these three regions having high impurity concentration, and the source electrode projecting from the surface of the insulating layer; and first and second gate electrodes electrically connected to the first and second polycrystal layers, and projecting from the surface of the insulating layer.

2. The MOS-type integrated circuit according to claim 1, wherein the first conductivity type is a p-type, and the second conductivity type is an n-type.

3. The MOS-type integrated circuit according to claim 2, including a level-shifting p-channel MOSFET having high breakdown voltage, and an n-channel MOSFET having high breakdown voltage.

4. An MOS-type integrated circuit comprising;
a semiconductor substrate of a first conductivity type; and a plurality of interconnected islands, each island including
a semiconductor layer, on the semiconductor substrate, of a second conductivity type,
a buried region, between the semiconductor substrate and the semiconductor layer, of the second conductivity type and having relatively high impurity concentration,
an annular contact region, extending from the buried region to the surface of the semiconductor layer, of the second conductivity type and having relatively high impurity concentration,
a first region, in contact with the annular contact region, of the second conductivity type and having relatively low impurity concentration,
a second region of the first conductivity type and having relatively high impurity concentration and a third region of the second conductivity type and having relatively high impurity concentration, the second and third regions being in mutual contact in the first region,
a fourth region, in contact with the first region, of the first conductivity type and having relatively low impurity concentration,
a fifth region, in the fourth region, of the first conductivity type and having relatively high impurity concentration,
a sixth region, on the upper surface of the semiconductor layer and surrounded by the annular contact region, of the first conductivity type and relatively low impurity concentration,
a seventh region, in the sixth region, of the second conductivity type and having a relatively high impurity concentration, an eighth region, opposed to the seventh region in the sixth region, of the first conductivity type and having a relatively high impurity concentration, and a ninth region, opposed to the eighth region in the sixth region, of the second conductivity type and having a relatively high impurity concentration,
an insulating layer, covering junctions of the regions of different conductivity types, exposed in the surface of the semiconductor layer,
a first polycrystal silicon layer buried in the insulating layer at a location corresponding to the first region and surrounding the second region and the third region,
a second polycrystal silicon layer buried in the insulating layer at a location corresponding to the sixth region and surrounding the seventh, eighth and ninth regions,
a drain electrode, electrically connected to the second and third regions, projecting from the surface of the insulating layer,
a source electrode, electrically connected to the eighth, seventh and ninth regions, the source electrode projecting from the surface of the insulating layer, and
first and second gate electrodes electrically connected to the first and second polycrystal layers and projecting from the surface of the insulating layer.

5. The MOS-type integrated circuit according to claim 4, wherein the first conductivity type is a p-type, and the second conductivity type is an n-type.

6. The MOS-type integrated circuit according to claim 5, including a level-shifting p-channel MOSFET having high breakdown voltage, and an n-channel MOSFET having high breakdown voltage.

* * * * *